United States Patent [19]

Oh et al.

[11] Patent Number: 5,355,339
[45] Date of Patent: Oct. 11, 1994

[54] ROW REDUNDANCY CIRCUIT OF A SEMICONDUCTOR MEMORY DEVICE

[75] Inventors: Seung-Cheol Oh; Moon-Gone Kim, both of Suwon, Rep. of Korea

[73] Assignee: Samsung Electronics Co., Suwon, Rep. of Korea

[21] Appl. No.: 91,839

[22] Filed: Jul. 13, 1993

[30] Foreign Application Priority Data

Jul. 13, 1992 [KR] Rep. of Korea ............... 12437

[51] Int. Cl.⁵ .................................. G11C 7/00
[52] U.S. Cl. ....................... 365/200; 371/10.2
[58] Field of Search ............ 365/200, 225.7, 230.03; 371/10.1, 10.2

[56] References Cited

U.S. PATENT DOCUMENTS

| | | | |
|---|---|---|---|
| 4,471,472 | 9/1984 | Young | 365/200 |
| 4,885,720 | 12/1989 | Miller et al. | 365/200 |
| 5,025,418 | 6/1991 | Asoh | 365/200 |
| 5,060,197 | 10/1991 | Park et al. | 365/200 |
| 5,124,948 | 6/1992 | Takizawa et al. | 365/200 |

FOREIGN PATENT DOCUMENTS

0124299 5/1988 Japan ........................ 371/10.2

OTHER PUBLICATIONS

B. F. Fitzgerald et al., "Memory System with High-Performance Word Redundancy," IBM Technical Disclosure Bulletin, vol. 19, No. 5, Oct. 1976, pp. 1638–1639.

*Primary Examiner*—Eugene R. LaRoche
*Assistant Examiner*—Son Dinh
*Attorney, Agent, or Firm*—Cushman, Darby & Cushman

[57] ABSTRACT

Disclosed is a semiconductor device with redundancy for replacing a memory cell with a predetermined defect with additional spare cells. In a semiconductor memory device having a plurality of normal submemory arrays, the present invention discloses a redundancy technique that allows any redundant address decoder to be used with any of the submemory arrays. This maximizes efficiency in redundant repairs as well as maximizes the use of the chip area.

11 Claims, 10 Drawing Sheets

(PRIOR ART) FIG. 1

ROW REDUNDANCY CIRCUIT OF A SEMICONDUCTOR MEMORY DEVICE

BACKGROUND OF THE INVENTION

1. Field of the Invention

The present invention relates to a redundancy circuit of a semiconductor memory device and more particularly to substituting memory cells having defective rows with redundant or spare memory cells.

2. Description of the Related Art

One common technique used to improved the yield of a particular semiconductor memory fabrication process is to "repair" defective memories which result from the fabrication process. Repairing cells increases the percentage of usable memories resulting from the repairs and the original fabrication process. Semiconductor memories are commonly fabricated with redundant memory cells (generally called spare memory cells) to replace defective memory cells within the same memory.

It is known to the public that the redundancy has been proposed to improve the yield of a semiconductor memory device. Here, the term "redundancy" refers to a process for replacing a predetermined memory cell when a defect occurs, therein with redundant memory cells (i.e., commonly designated as spare memory cells). For example, in case of a row redundancy, a row address corresponding to the memory cell with the defect is decoded and used to remedy the defect in the normal memory cell by means of the additional redundant cells. Substituting the redundant row of memory cells for the row with the defect thus "repairs" the memory device.

Generally, as packing density increases the number of the memory cells increase. Recently, memory cells are arranged in a plurality of submemory cell arrays. Usually, a redundant memory cell array is provided within each such submemory cell array, so that when a defective memory cell occurs in one of the submemory cell arrays, the defective memory cell row in the array is repaired by means of the redundant row of memory cells.

In connection with this operation, a block diagram illustrating a memory device using such a conventional repair method is shown in FIG. 1. Here, the memory cell array is formed of four submemory cell arrays MA0, MA1, MA2 and MA3. The submemory cell arrays respectively have row decoders X0, X1, X2 and X3, and spare word lines, which are generally referred as redundant word lines. Also, spare decoders SD0, SD1, SD2 and SD3 are provided for driving the spare word lines during the redundancy operation. The number of the spare decoders SD0, SD1, SD2 and SD3 is the same as the number of the spare word lines within each submemory cell array MA0, MA1, MA2 and MA3. The spare decoders SD0, SD1, SD2 and SD3 receive internal submemory cell array address signal $a_0$–$a_{n-3}$ and drive the spare word lines by means of their combination rather than the normal word line. Therefore, if the defect occurs in the normal word line of the submemory cell array MA0, for example, the defective word line address is programmed in one of the spare decoders SD0, SD1, SD2 and SD3. Substituting this spare word line for the normal work line thus repairs the submemory array.

However, in the device shown in FIG. 1, four spare word lines are substituted for one defective normal word lines (i.e., the normal word lines without defects are also substituted in each of the submemory arrays). Because the probability of a defect in the spare word lines increases. Moreover, the number spare word lines provided for each submemory cell array is predetermined and not alterable, which leads to an increase in the required chip area.

FIG. 2 shows another example illustrating memory device using another conventional redundancy technique. In the FIG. 2 device, the spare word lines provided one submemory cell array number less than those of FIG. 1, (two rather than four) and a spare decoder for driving each spare word line is provided as shown in the construction of FIG. 2. If one normal word line is defective in a given submemory array, this defective word line is repaired by only one spare word line in that submemory array. Also, each defective normal word line causes substitution of only a single word line. This one-to-one repair method is performed by enabling only the one spare decoder.

The system shown in FIG. 2 thus solves the above-described problems of all the redundant word lines in each submemory array being substituted, but it also has problems. Since the number of the spare word lines provided to one submemory cell array decreases, defect cannot be repaired when the number of the defective normal word lines in a submemory cell array is greater than the number of the spare word lines provided to the submemory cell array. Furthermore, one spare decoder must be provided for each spare word line which increases the required number of the spare decoders. Thus the area occupied by the spare decoders is increased which is not suitable for high packing density.

FIG. 3 shows a memory device using yet another conventional technique to solve the above-described problems. The redundancy shown in FIG. 3 is referred to in Korean Patent Application No. 90-21502 entitled: "Redundancy circuit and Method of a Semiconductor Memory Device" filed by this applicant. The circuit shown in FIG. 3 contains a redundant cell array 14, which is used with two normal memory cell arrays 10 and 13, and an isolation gate 12 is installed between the two normal memory cell arrays 10 and 13. In the redundant operation mode, a redundant sense amplifier 15, connected redundant memory cell array 14, is operated. Thus, regardless of whether the defect occurs in either of the normal memory cell arrays 10 or 13, the defect can be repaired using only by means of one redundant memory cell array 14. Thus, this device desirably decreases the required size and/or increases the packing density. However, in the device shown in FIG. 3, since the spare word line and a redundancy decoder circuit are dependent upon the normal memory cell arrays 10 and 13, word-line failures can only be repaired by the associated redundant memory cell array. Because defects in the memory cells normally do not uniformly appear, but tend to be concentrated in, for instance, a single memory array, the fact that the number of repairable cells is restricted by the number of associated redundant memory cells restricts the improvement of redundancy efficiency. Also, while the layout of the FIG. 3 design obtains a higher packing density than the FIGS. 1 and 2 embodiments, a still higher packing density is needed for current memory device designs.

SUMMARY OF THE INVENTION

Accordingly, it is an object of the present invention to provide a semiconductor memory device having a redundant cell array which further enhances high packing density.

It is yet another object of the present invention to provide a semiconductor memory device having a redundancy circuit optimized for the layout of a chip.

It is still another object of the present invention to provide a semiconductor memory device capable of repairing word line failures occurring in different normal memory cell arrays using spare word lines within one redundant memory cell array.

It is still another object of the present invention to provide a semiconductor memory device capable of repairing many word line failures occurring in a single normal memory cell array.

Spare word lines are provided to a normal and redundant memory cell array disposed among a plurality of normal memory cell arrays. Accordingly, the other normal memory cell arrays have no spare word lines. Additionally, the greatest number of redundancy decoder circuits are provided as the chip layout permits. As a result, when a word line defects occur in any portion of any of the normal memory cell arrays, the single normal and redundant memory cell array is used to repair the defect.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE PRESENTLY PREFERRED EXEMPLARY EMBODIMENTS

Figure 4:
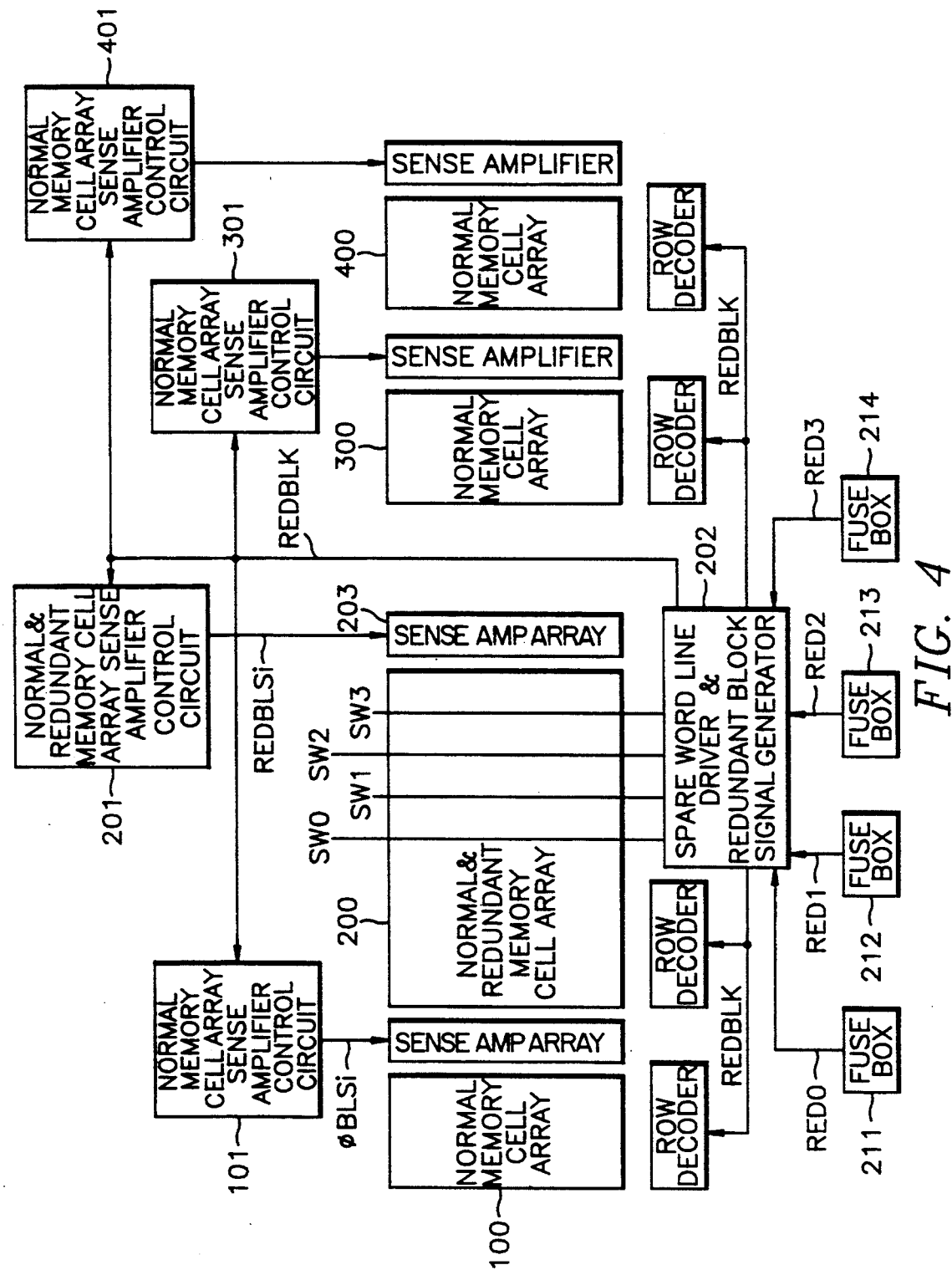
FIG. 4 is a block diagram showing the construction of a memory device having redundancy according to the present invention.

FIG. 4 is a block diagram illustrating a semiconductor memory device having redundancy according to the present invention. Redundancy decoder circuits (or fuse boxes) 211, 212, 213 and 214 are requisite elements for the redundancy. Unlike the conventional techniques, the redundancy decoder circuits represented by 211, 212, 213 and 214 may be arranged at any location, considering the layout of the chip. The redundant row decoders do not need to be proximate to any particular memory array, for example. The number of such redundancy decoder circuits can be less than, equal to or greater than the number of the normal memory cell arrays. A normal and redundant memory cell array sense amplifier control circuit 201 controls a sense amplifier array 203 provided to the normal and redundant memory cell array 200, and allows normal operation wherein data access is carried out in the normal memory cell array during normal operation and the redundant data access is used upon enabling (or activation) of the redundancy operation. The normal and redundant memory cell array sense amplifier control circuit 201 serves as a normal/redundancy selecting circuit, and receives a row address and a selection signal REDBLK indicative of the particular memory cell array to be addressed. If addressed, it outputs a predetermined control signal REDBLSi to a sense amplifier array 203. The spare word line driver and redundant block signal generator 202 contains the spare word line diver circuits that drive the spare word lines SW0, SW1, SW2 and SW3 in accordance with the output signals from the redundancy decoder circuits 211, 212, 213 and 214. The redundant block signal generator thus generates a REDBLK signal which indicates whether redundancy is activated.

The spare word line driver and redundant block signal generator receive output signals from the redundant address decoder circuits (or fuse boxes) 211, 212, 213 and 214, and then, generate the REDBLK signal a redundant address is detected on any of the redundant address decoders 211–214. It should be noted that output signals RED0, . . . , RED3 the fuse boxes 211, 212, 213 and 214 are output, when they occur and after signal conditioning by spare word line driver and redundant block signal generator 202 along spare work lines SW0–SW3. Block 202 thus functions as one control circuit for enabling the redundancy operation. Normal memory cell array sense amplifier control circuits 101, 301 and 401 are provided to disable a selected normal memory cell array when an operation using redundancy takes place. Disabling is achieved by the generation of redundant block selection signal REDBLK. The spare word lines shown in FIG. 4 as a representation four (SW0, SW1, SW2 and SW3), may be a different number depending on the layout of the chip.

The operational characteristics of the above-described device will now be described. If a memory cell failure appears in a specific normal memory cell array, the redundant cell and spare word lines are utilized to repair the failed memory cell. For this operation, the redundancy address decoder circuit is then programmed with an address corresponding to the failed row address (such a process is disclosed in detail in Korean Patent Application Nos. 91-12919 and 90-21502 filed by this applicant and expressly incorporated by reference). At a subsequent time, in use, when this address is detected by that redundant address decoder circuit, the programmed signal thus obtained is the output signal REDi (where i=0,1,2,3 . . . ) of the redundancy decoder circuits such as represented by 211, 212, 213 and 214. The signal REDi is input to the spare word line driver 202. The signal REDi generates a signal REDBLK to disable the normal memory cell array sense amplifier control circuits 101, 301 and 401, and the dependent row decoders and normal word lines, thereby inhibiting the normal memory cell arrays 100, 300 and 400 from operating. The signal REDBLK also enables the normal and redundant memory cell array sense amplifier control circuit 201 to thus operate the redundant memory cell array 200.

The signal REDi (where i=0,1,2,3) previously input to the spare word line driver 202, drives the spare word lines upon enabling of word line driver by ΦX0 and input of the word line boosting signals ΦX0 and ΦX1, which are input to the spare word line driver 202 and connected to the word lines as is well known in the art.

The schematic diagram of the specific circuits constituting each block of FIG. 4 will now be described.

Figure 1:
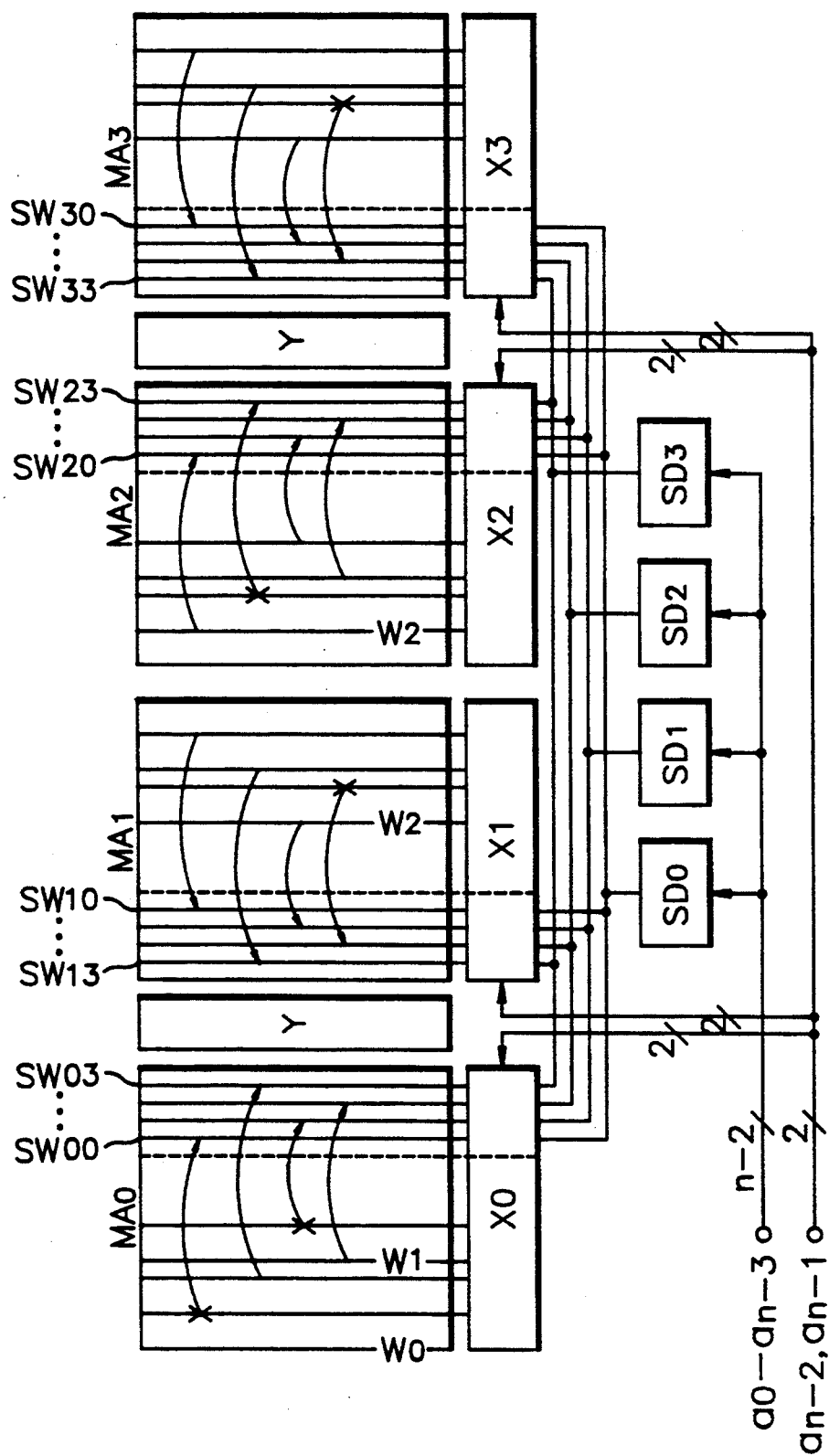
FIG. 1 is one example showing a memory device having redundancy according to a conventional technique.
Figure 2:
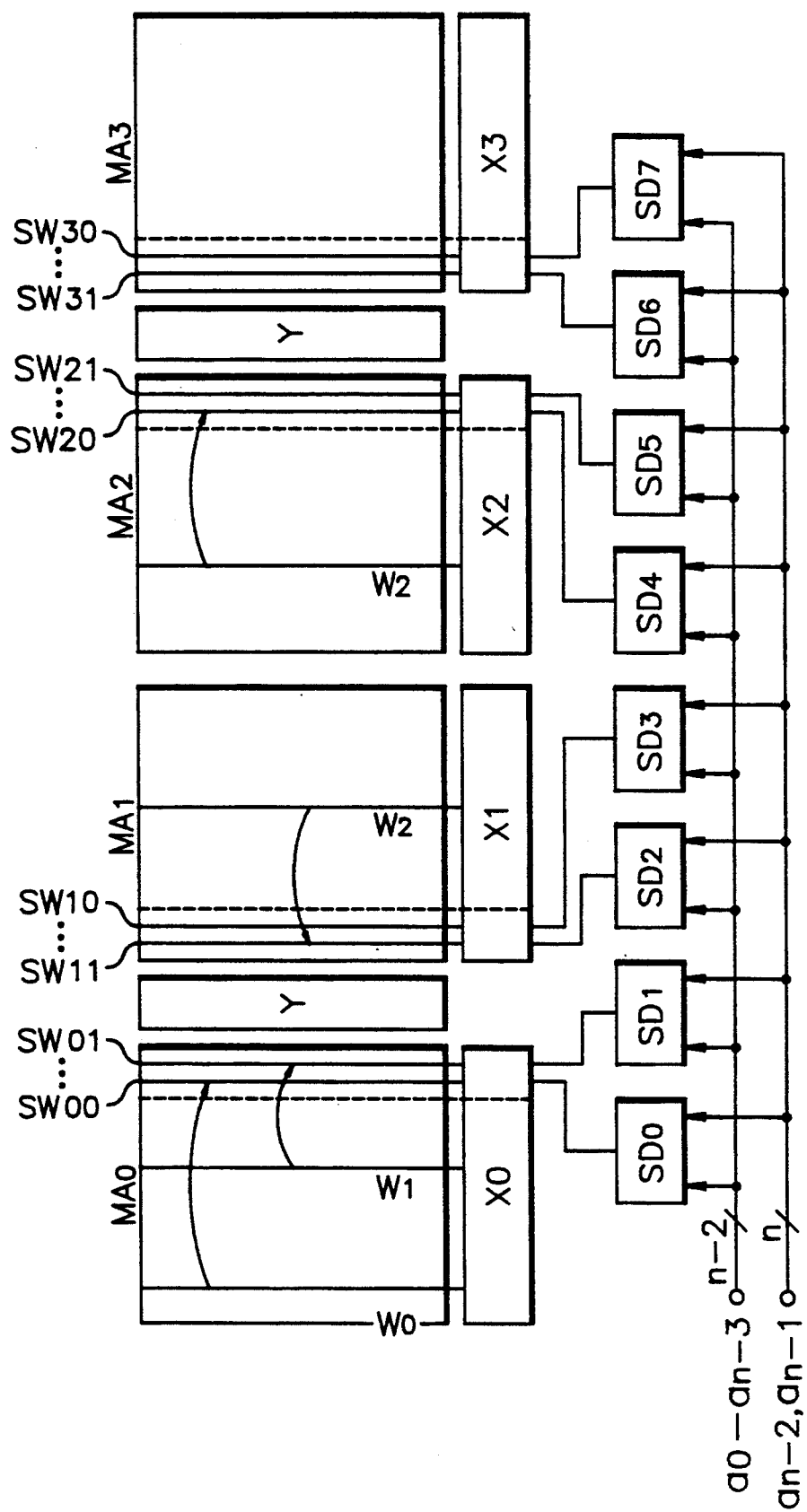
FIG. 2 is another example showing a memory device having redundancy according to a conventional technique.
Figure 3:
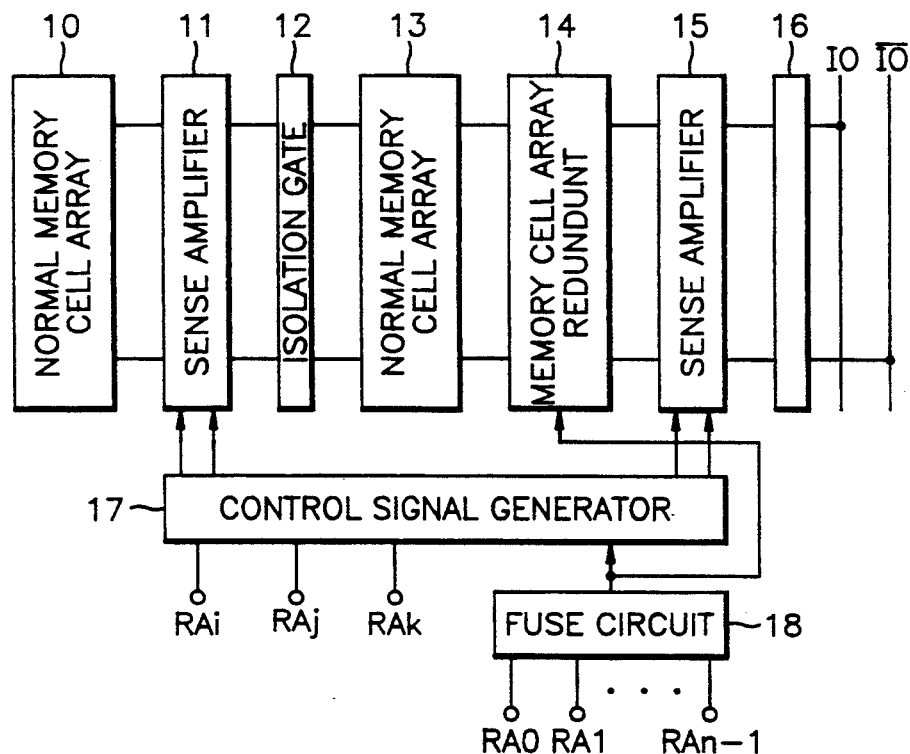
FIG. 3 is still another example showing a memory device having redundancy according to a conventional technique.
Figure 5:
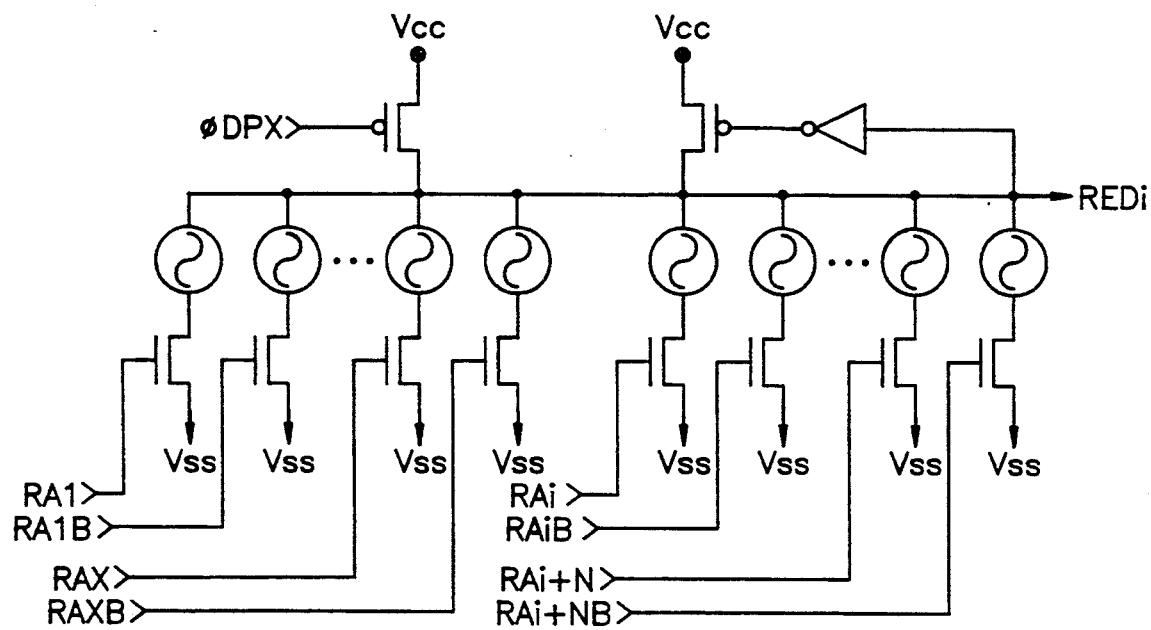
FIG. 5 shows an embodiment of the redundancy decoder circuit shown in FIG. 4.

The embodiment of the redundant address decoder circuits (or fuse boxes) 211, 212, 213 and 214 shown in FIG. 4 can be formed as shown in FIG. 5. Here, row addresses are input along the address lines illustrated in normal use. Earlier in time, the redundant address circuit, fuses were cut preferably by a laser to cause generation of the signal REDi in normal use when the programmed redundant address is detected.

Figure 6:
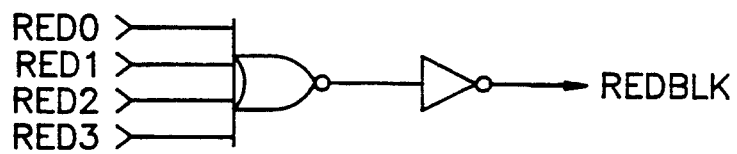
FIG. 6 shows an embodiment of the redundant block signal generator shown in FIG. 4.

FIG. 6 illustrates an embodiment of the redundant block signal generator of the spare word line driver and redundant block signal generating circuit 202. NOR gate 250 receives each output signal RED0, RED1, RED2 and RED3 of the redundancy decoder circuits 211, 212, 213 and 214, which, once inverted by inverter 252, produces the redundant block signal REDBLK.

Figure 7:
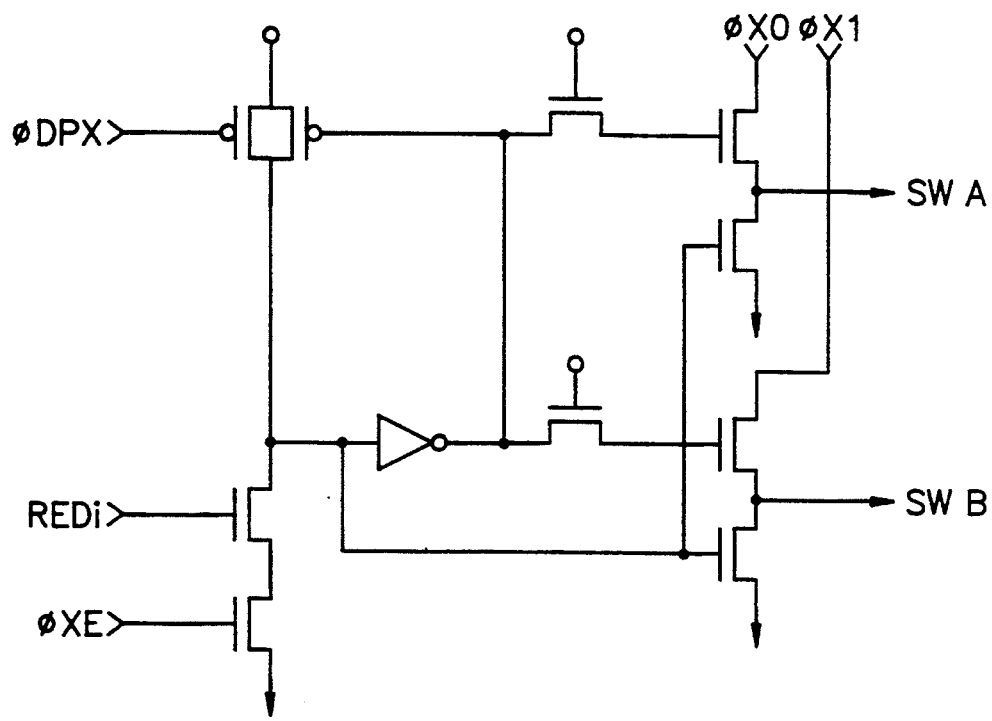
FIG. 7 shows an embodiment of the spare word line driver shown in FIG. 4.

An embodiment of the spare word line driver shown in FIG. 4 can be simply formed as shown in FIG. 7. In this embodiment, the word line boosting signals ΦX0 and ΦX1 are instantly connected to the spare word lines.

Figure 8:
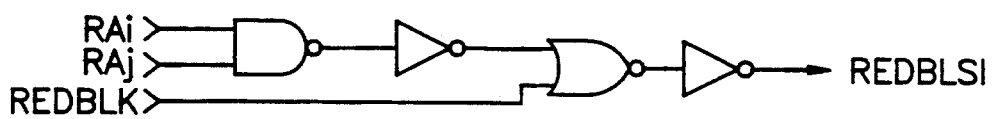
FIG. 8 shows an embodiment of the sense amplifier control circuit shown in FIG. 4.

The normal and redundant memory cell array sense amplifier control circuit 201 of FIG. 4 is illustrated in further detail in FIG. 8. The normal and redundant memory cell array sense amplifier control circuit 201 receives the row addresses and the output signal REDBLK from the redundant block signal generator 202, thereby controlling the sense amplifier array 203 shown in FIG. 4.

Figure 9:
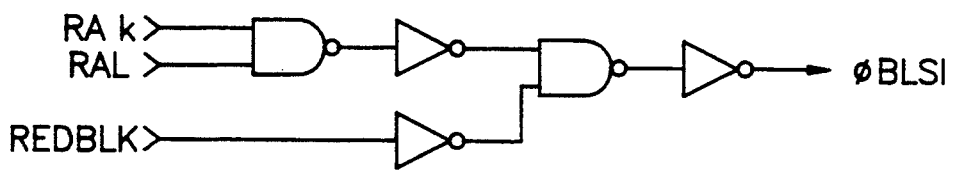
FIG. 9 shows an embodiment of the normal cell array selecting circuit shown in FIG. 4.

Referring to FIG. 9, an embodiment of the normal memory cell array sense amplifier control circuits 101, 301 and 401 are illustrated. The normal memory cell array sense amplifiers control circuits 101, 301 and 401 receive the row address and the output signal REDBLK from the redundant block signal generator 202, thereby controlling the sense amplifiers dependent upon each normal memory cell array of FIG. 4.

Figure 10A:
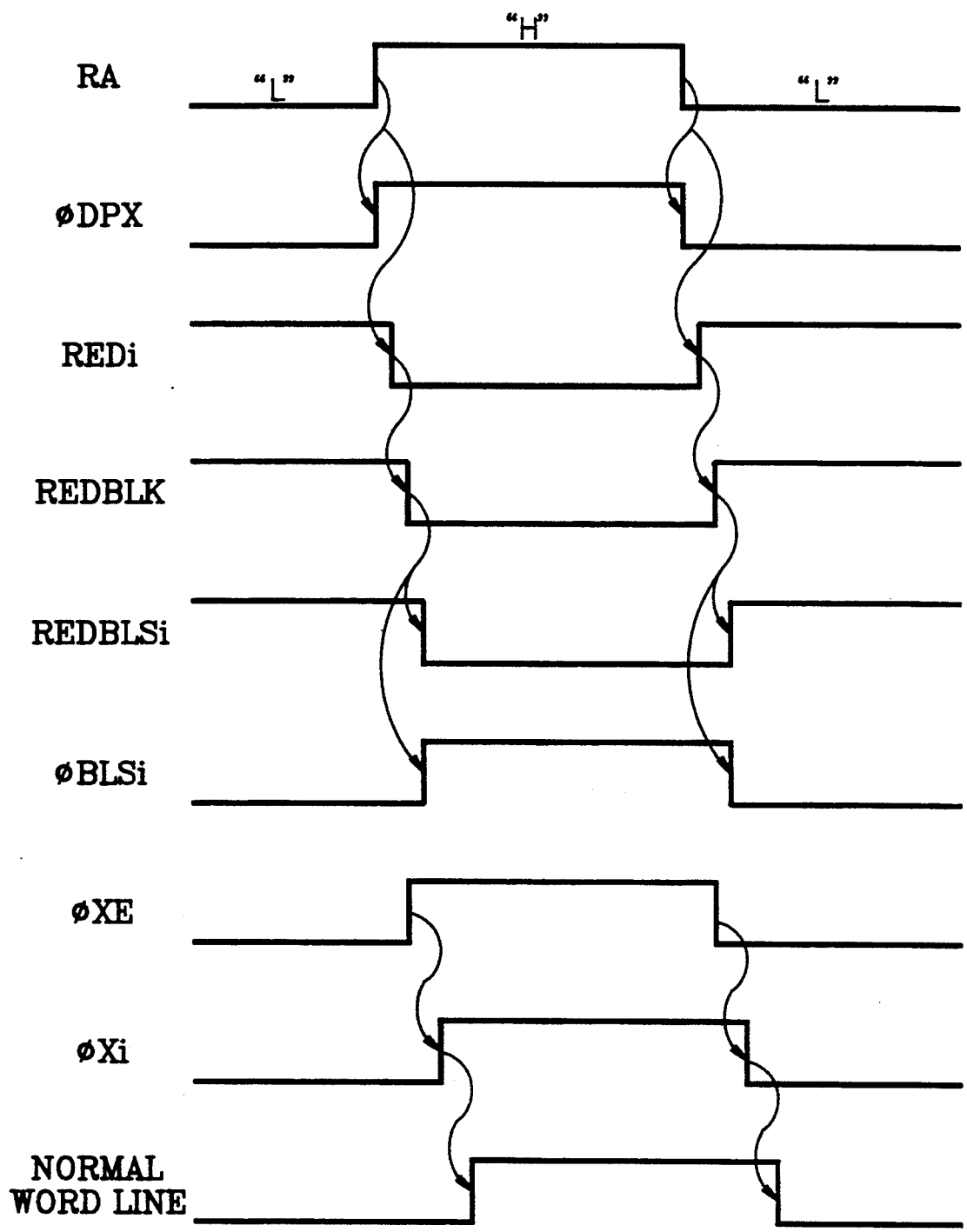
FIGS. 10A and 10B are timing diagrams illustrating control signals related to the present invention.
Figure 10B:
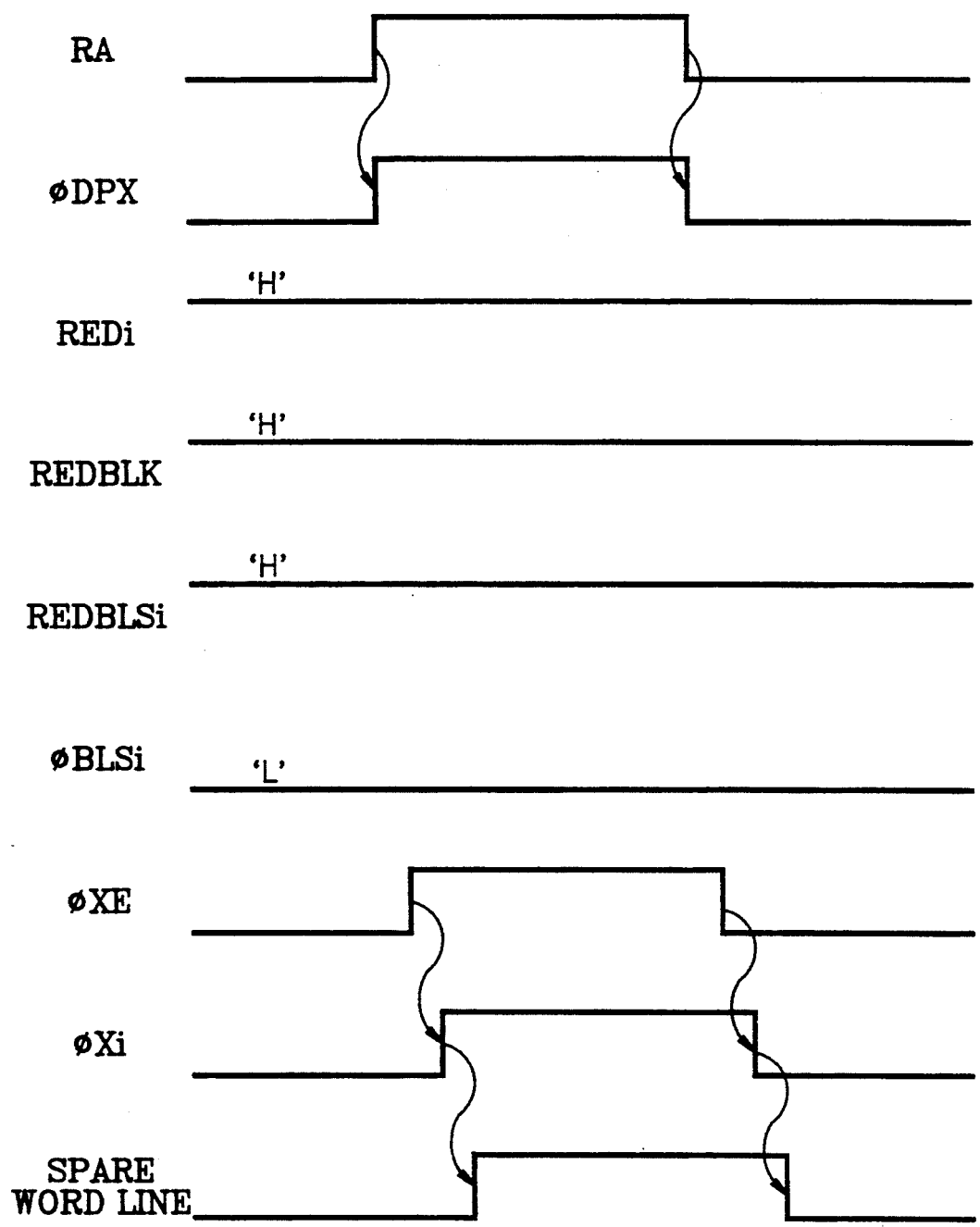

The timing of each of the signals used to operate the circuits illustrated in FIGS. 4 to 9 are illustrated in FIGS. 10A and 10B. As shown in FIG. 10A, during the normal operation of a normal memory array, the output signal REDi of the fuse boxes 211, 212, 213 and 214 of FIG. 4, previously programmed, is in logic "low" level, and then the output signal REDBLK of the redundant block signal generator 202 of FIG. 6 becomes logic "low" level. Thus, the output signal REDBLSi of the normal and redundant array sense amplifier control circuit of FIG. 8 is in logic "low" level, and the output signal ΦBLSi of the normal memory cell array sense amplifier control circuit of FIG. 9 is changed to logic "high" level. Thereafter, the word line boosting signal ΦXi is in logic "high" level to thereby select the normal word line.

However, during a redundancy operation, as shown in FIG. 10B, the output signal REDi becomes logic "high" level by due to the detected defective address among the redundancy decoder circuits 211, 212, 213 and 214 of FIG. 4, which makes the output signal REDBLK of the redundant block signal generator shown in FIG. 6 change to logic "high" level. Then, the output signal REDBLSi of the normal and redundant array sense amplifier control circuit shown in FIG. 8 is in logic "high" level, and the output signal ΦBLSi of the normal memory cell array sense amplifier control circuit shown in FIG. 9 is changed to logic "low" level. Finally, the spare word line is selected. It should be noted that if the detective address is located within the normal memory array associated with normal and redundant memory cell array 200, that the FIG. 10B operation will occur, whereas if the normal memory array associated with normal and redundant memory cell array 200 is used normally that the FIG. 10A operation will occur. In both instances, a sense amplifier array 203 is used.

Figure 11A:
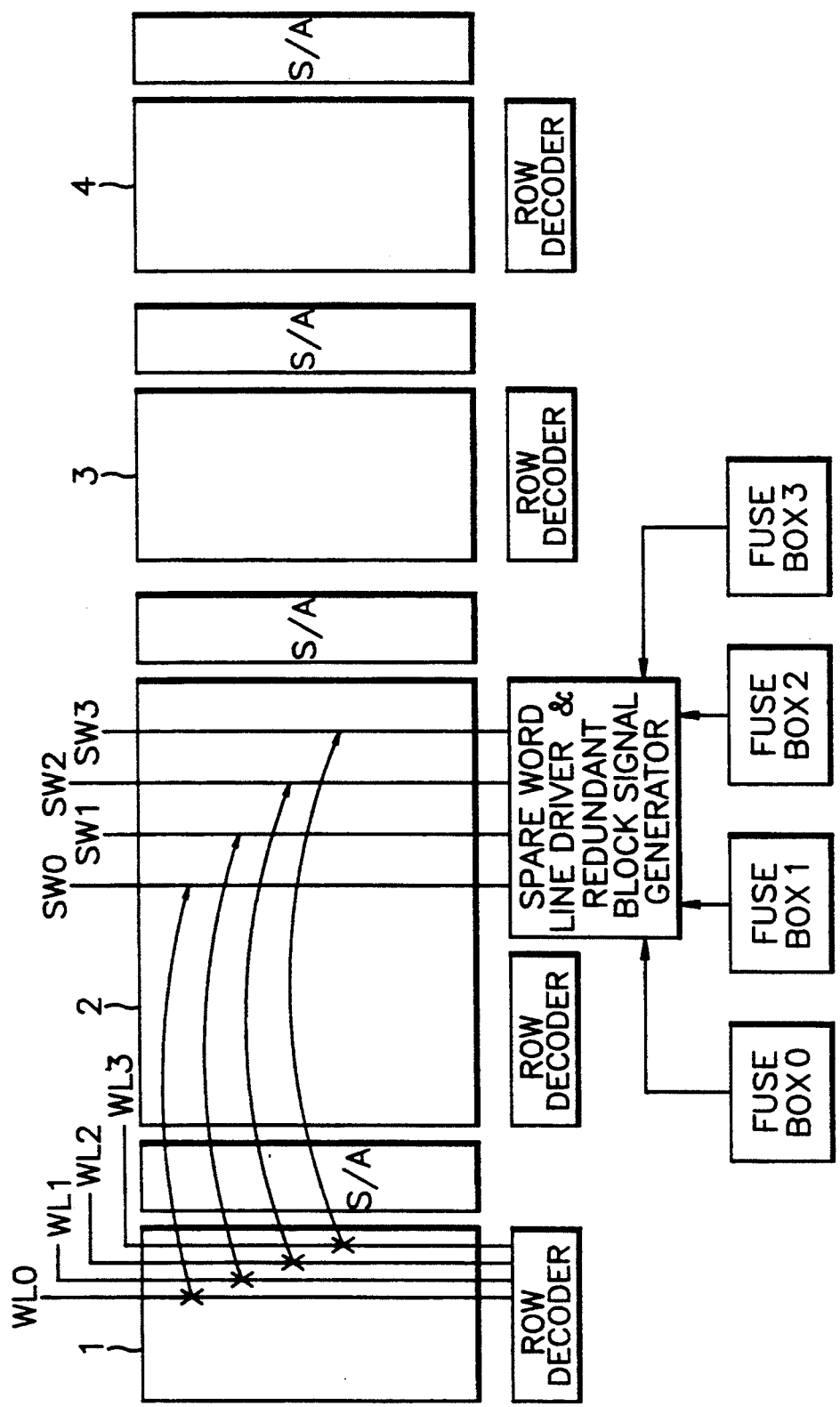
FIGS. 11A to 11C are simplified block diagrams of the present invention illustrating the operation thereof.
Figure 11B:
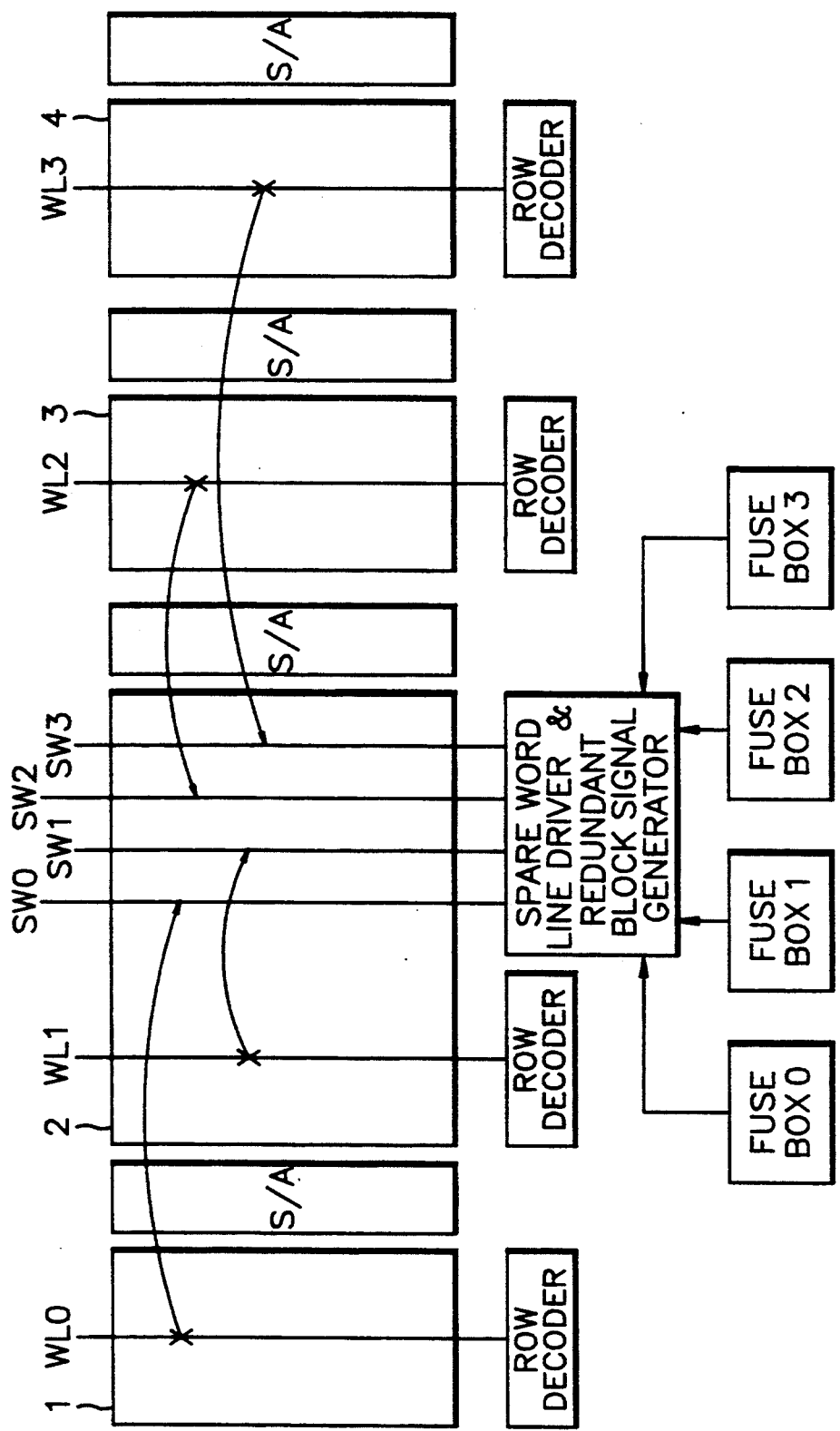
Figure 11C:
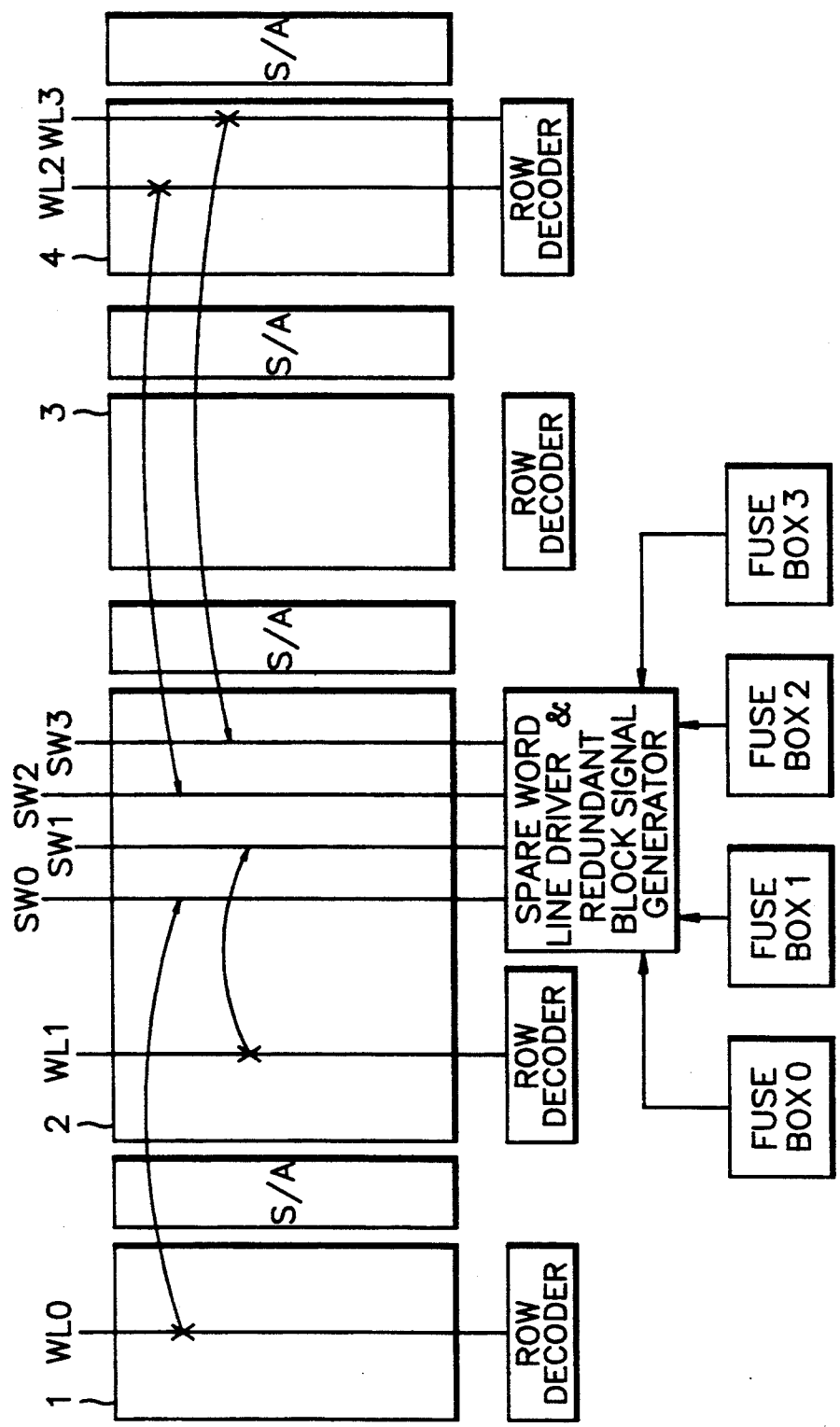

In order to assist in understanding the present invention, the block diagrams of the present invention are marked to illustrate operation of the present invention in FIGS. 11A, 11B and 11C. In FIG. 11A, even if four word lines WL1, WL2, WL3 and WL4 simultaneously fail in one normal memory cell array, the failure correction is programmed by the fuse boxes 1, ... , 3 so that the failed word lines are replaced with the spare word lines SW0, SW1, SW2 and SW3. In FIG. 11B, one word line failure in every normal memory cell array can be repaired. Referring to FIG. 11C, one word line failure in a normal memory cell array 1, one in a normal memory cell array 2, no fail in a normal memory cell array 3, and two in a normal memory cell array 4 are all repaired by the programming of the redundant address decoders. As described above, all of the redundant address decoders can be utilized independently of any particular memory cell array, resulting in improved efficiency and yield of the semiconductor memory.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A semiconductor memory device disposed on a semiconductor chip comprising:

a plurality of memory cell arrays arranged in rows and columns, each memory cell array containing a plurality of memory cells for storing data and normally addressable using a normal row address and a normal column address;

a normal row decoder associated with each of said plurality of memory cell arrays for decoding said normal row address to obtain a decoded normal row address signal corresponding to one of said rows;

means for selecting one of said rows in said memory array using said decoded normal row address signal, said means for selecting including a plurality of word lines;

a plurality of sense amplifier arrays, each sense amplifier array connected to one of said plurality of memory cell arrays, for sensing said data stored in said memory cells;

a redundant memory cell array disposed within one of said plurality of memory cell arrays for storing data in a plurality of redundant memory cells, said redundant memory array connected to one of said sense amplifier arrays;

a plurality of redundant row address decoders, each redundant row address decoder programmed to decode a redundant row address corresponding to a defective normal memory cell address and which outputs a redundant decoded row address signal when said redundant row address is decoded;

redundant means for selecting at least one of said rows in said redundant memory array using at least one of said decoded redundant row address signals, said redundant means for selecting including a plurality of redundant word lines; and a control circuit for inputting each of said redundant decoded row address signals and outputting a redundancy control signal to each of said normal row decoders and each of said sense amplifier arrays.

2. A semiconductor memory device according to claim 1, wherein each of said redundant row decoders are arranged on said semiconductor chip in locations not dependent upon a placement of each of said plurality of memory cell arrays.

3. A semiconductor memory device according to claim 1, wherein said redundant means for selecting includes a word line driver for receiving each of said redundant decoded row address signals and enabling respective redundant word lines; and wherein said redundancy control signal is generated by said control circuit when a redundancy operation required and disables said normal row decoders during said redundancy operation.

4. A semiconductor memory device according to claim 3 wherein said redundancy control signal is input to each of said plurality of sense amplifier arrays so that only one of said sense amplifier arrays operates at any given time.

5. A semiconductor memory device according to claim 4 wherein said one sense amplifier array to which said redundant memory array is connected is operated during a redundancy operation.

6. A semiconductor memory device disposed on a semiconductor chip comprising:

a plurality of memory cell arrays;

a normal row decoder associated with each of said plurality of memory cell arrays;

a plurality of sense amplifier arrays, each sense amplifier array connected to one of said plurality of memory cell arrays;

a redundant memory cell array disposed within one of said plurality of memory cell arrays;

a plurality of redundant row address decoders, each redundant row address decoder programmed to decode a redundant row address corresponding to a defective normal memory cell address and which outputs a redundant decoded row address signal when said redundant row address is decoded;

redundant means for selecting at least one of said rows in said redundant memory array using at least one of said redundant decoded row address signals, said redundant means for selecting including a plurality of redundant word lines; and a control circuit for inputting each of said redundant decoded row address signals and outputting a redundancy control signal to said one sense amplifier array connected to said redundant memory array to enable said one sense amplifier array and to each of said normal row decoders to disable said normal row decoders during a redundancy operation.

7. A semiconductor memory device according to claim 6, wherein each of said redundant row decoders are arranged on said semiconductor chip in locations not dependent upon a placement of each of said plurality of memory cell arrays.

8. A semiconductor memory device according to claim 6 wherein said redundant means for selecting includes a word line driver for receiving each of said redundant decoded row address signals and enabling respective redundant word lines.

9. A semiconductor memory device disposed on a semiconductor chip comprising:

a plurality of memory cell arrays;

a plurality of sense amplifier arrays, each sense amplifier array connected to one of said plurality of memory cell arrays;

a redundant memory cell array;

a redundant sense amplifier connected to said redundant memory cell array;

a plurality of redundant row address decoders, each redundant row address decoder programmed to decode a redundant row address corresponding to a defective normal memory cell address and which outputs a redundant decoded row address signal when said redundant row address is decoded;

redundant means for selecting at least one of said rows in said redundant memory array using at least one of said redundant decoded row address signals, said redundant means for selecting including a plurality of redundant word lines; and a control circuit for inputting each of said redundant decoded row address signals and outputting a redundancy control signal to said redundant sense amplifier array connected to said redundant memory array to enable said redundant sense amplifier array and to each of said other sense amplifiers arrays to disable said other sense amplifiers arrays during a redundancy operation.

10. A semiconductor memory device according to claim 9, wherein each of said redundant row decoders are arranged on said semiconductor chip in locations not dependent upon a placement of each of said plurality of memory cell arrays.

11. A semiconductor memory device according to claim 9 wherein said redundant means for selecting includes a word line driver for receiving each of said redundant decoded row address signals and enabling respective redundant word lines.

* * * * *